US012032235B2

(12) United States Patent
Regimbal et al.

(10) Patent No.: US 12,032,235 B2
(45) Date of Patent: Jul. 9, 2024

(54) INFORMATION HANDLING SYSTEM EDGE-TO-EDGE DISPLAY

(71) Applicant: Dell Products L.P., Round Rock, TX (US)

(72) Inventors: Laurent Andrew Regimbal, Georgetown, TX (US); Glenn Chiappe, Lago Vista, TX (US)

(73) Assignee: Dell Products L.P., Round Rock, TX (US)

( * ) Notice: Subject to any disclaimer, the term of this patent is extended or adjusted under 35 U.S.C. 154(b) by 538 days.

(21) Appl. No.: 16/938,322

(22) Filed: Jul. 24, 2020

(65) Prior Publication Data

US 2022/0026757 A1 Jan. 27, 2022

(51) Int. Cl.
| G02F 1/1333 | (2006.01) |
| G02F 1/1335 | (2006.01) |
| G06F 1/16 | (2006.01) |
| G09G 5/36 | (2006.01) |
| H10K 50/84 | (2023.01) |
| H10K 50/86 | (2023.01) |
| H10K 71/00 | (2023.01) |

(52) U.S. Cl.
CPC .. *G02F 1/133308* (2013.01); *G02F 1/133528* (2013.01); *G06F 1/1616* (2013.01); *G06F 1/1637* (2013.01); *G09G 5/363* (2013.01); *H10K 50/841* (2023.02); *H10K 50/86* (2023.02); *H10K 71/00* (2023.02); *G02F 1/13332* (2021.01); *G02F 2202/28* (2013.01)

(58) Field of Classification Search
CPC ................................................. G02F 1/133308
See application file for complete search history.

(56) References Cited

U.S. PATENT DOCUMENTS

| 8,395,722 | B2 | 3/2013 | Mathew et al. | |
|---|---|---|---|---|
| 8,467,177 | B2 | 6/2013 | Mathew et al. | |
| 9,069,525 | B2 | 6/2015 | Mathew et al. | |
| 9,372,505 | B2 | 6/2016 | Mathew et al. | |
| 9,575,354 | B2 | 2/2017 | Mathew et al. | |
| 10,353,432 | B2 | 8/2019 | Mathew et al. | |
| 2009/0185122 | A1* | 7/2009 | Takahashi | G02F 1/133308 349/122 |
| 2014/0043744 | A1* | 2/2014 | Matsuoka | G06F 1/1658 361/679.01 |
| 2015/0286090 | A1* | 10/2015 | Yoshimoto | G02F 1/133308 438/23 |
| 2019/0196265 | A1* | 6/2019 | Fujihara | G02F 1/13338 |
| 2020/0192144 | A1* | 6/2020 | Oh | G02F 1/133502 |

* cited by examiner

*Primary Examiner* — Edmond C Lau
(74) *Attorney, Agent, or Firm* — ZAGORIN CAVE LLP; Robert W. Holland

(57) ABSTRACT

An information handling system display has an edge-to-edge appearance with a polarizer disposed as an outer layer in a housing perimeter and supported by a stainless steel support structure coupled to an underlying display module that frames the display area and extends to the housing perimeter. Flowable optically clear adhesive disposed between the display module and polarizer provides a planar outer surface relative to a height of the support structure.

13 Claims, 4 Drawing Sheets

INFORMATION HANDLING SYSTEM EDGE-TO-EDGE DISPLAY

BACKGROUND OF THE INVENTION

Field of the Invention

The present invention relates in general to the field of information handling system displays, and more particularly to an information handling system edge-to-edge display.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Portable information handling systems integrate processing components, a display and a power source in a portable housing to support mobile operations. Portable information handling systems allow end users to carry a system between meetings, during travel, and between home and office locations so that an end user has access to processing capabilities while mobile. Tablet configurations typically expose a touchscreen display on a planar housing that both outputs information as visual images and accepts inputs as touches. Convertible configurations typically include multiple separate housing portions that rotationally couple to each other so that the system converts between closed and open positions. For example, a main housing portion integrates processing components and a keyboard and rotationally couples with hinges to a lid housing portion that integrates a display. In clamshell configuration, the lid housing portion rotates approximately ninety degrees to a raised position above the main housing portion so that an end user can type inputs while viewing the display. After usage, convertible information handling systems rotate the lid housing portion over the main housing portion to protect the keyboard and display, thus reducing the system footprint for improved storage and mobility.

Generally, portable information handling system size is driven by the footprint of the display in the housing. End user's tend to prefer that an integrated display have as large of a viewing area as possible so that visual images presented by the display are easier to view and to interact with when a touch detection sensor is included in the display. However, display panels generally have electronic devices along their periphery so that some portion of the outer perimeter does not present visual images. In addition, to protect the perimeter of the display from physical damage, a bezel is typically placed around the display perimeter that covers the electronic devices. Conventional displays have included a cover glass over the outer surface that helps to protect the underlying display panel and aids with integration of touch detection sensors. The cover glass typically couples to a display with an optically clear adhesive (OCA). A display assembly under the cover glass generally includes an upper polarizer layer to polarize light leaving underlying display electronics, such as a liquid crystal module (LCM). A lower polarizer layer couples under the LCM to polarize light entering the LCM from a backlight source. In addition, a color filter controls the light colors that enter the LCM, such as to provide red, green and blue light of a desired quality. Generally, information handling system manufacturers attempt to minimize the thickness and weight of the display layers to provide a system that is as thin and low weight as possible.

Generally, the installation of a touch sensor and cover glass create an additional step in the supply chain and manufacture of information handling systems, which increases manufacture costs. The cover glass is generally also used to create an impression of an edge-to-edge display for portable information handling systems. Having a cover glass across the entire front face of a display presents a premium look that provides the end user with a display surface that is not interrupted at the front of the screen with external bezels. However, the cover glass tends to add both thickness and weight to the system. Recently, the introduction of in-cell touch detection sensors have helped to simplify portable display manufacture by integrating touch detection with the display module instead of the cover glass. Although this simplifies display manufacture, an external cover glass is generally placed over the display to provide the edge-to-edge display appearance and to ensure adequate physical support that prevents the display from breaking.

SUMMARY OF THE INVENTION

Therefore, a need has arisen for a system and method which provides an information handling system display having an edge-to-edge display.

In accordance with the present invention, a system and method are provided which substantially reduce the disadvantages and problems associated with previous methods and systems for integrating a display in an information handling system with an edge-to-edge front appearance. A support structure, such as a stainless steel frame, couples to a polarizer and a display module, such as a liquid crystal module, to support the polarizer at an area outside of the perimeter of the display module and to the perimeter of the housing holding the display.

More specifically, an information handling system processes information with processing components disposed in a housing and presents the information as visual images at a display integrated in the housing with an edge-to-edge front appearance. To provide the edge-to-edge appearance, a front polarizer is formed to fit into the information handling system housing at the perimeter of the housing and a support structure, such as a stainless steel frame, is formed to couple to the polarizer at the perimeter and support the polarizer out to the edge of the display housing perimeter. The support structure couples to an underlying display module with an inner perimeter of the support structure providing an opening through which the display module pixel area is visible.

A flowable optically clear adhesive couples the polarizer to the display panel and fills the vertical gap introduced by thickness of the support structure so that the polarizer has a planar outer surface for the display without a cover glass disposed over the polarizer.

The present invention provides a number of important technical advantages. One example of an important technical advantage is that a display has an outer surface of a polarizer without an outer glass cover. Using the polarizer as the outer surface provides a thinner display by eliminating thickness associated with the cover glass and lighter system. Conventional display modules that fit in a housing with a gap at the perimeter may be leveraged to support an edge-to-edge front display appearance by disposing a support structure, such as a stainless steel frame, on the display module and across the gap so that the polarizer has a robust upper surface out to the housing perimeter. The support structure weighs less than extending the display module upper surface to the housing perimeter and costs less with reduced complexity associated with manufacture of the information handling system.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

An information handling system display provides an edge-to-edge front surface with an exposed polarizer coupled to an underlying display module with a support structure. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
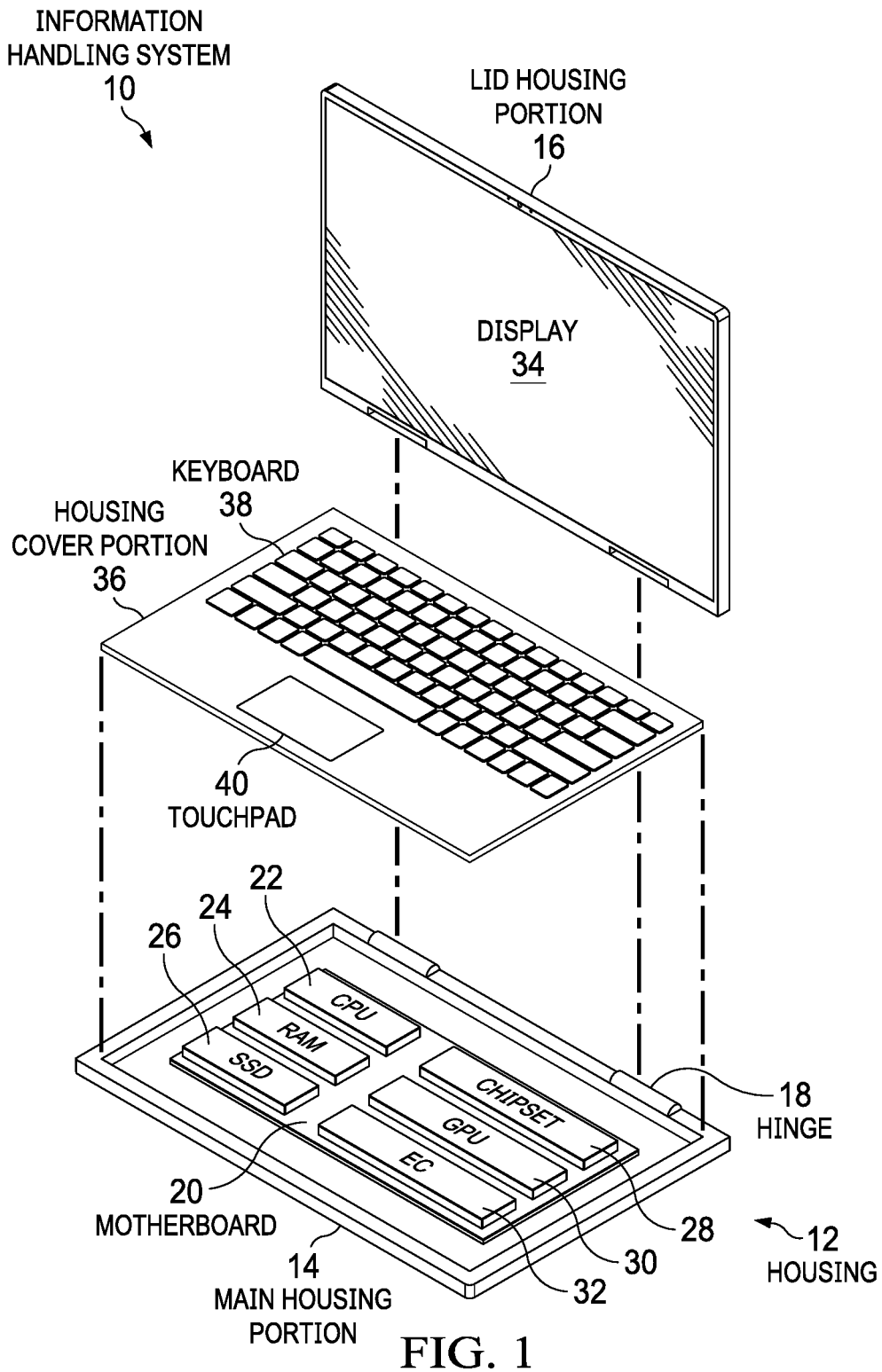
FIG. 1 depicts an exploded view of an information handling system having an edge-to-edge display front surface.

Referring now to FIG. 1, an exploded view depicts an information handling system 10 having an edge-to-edge display front surface. In the example embodiment, information handling system 10 has a portable housing 12 with a main housing portion 14 that contains processing components rotationally coupled to a lid housing portion 16 by a hinge 18. Housing 12 may, for example, rotated between a closed position, an open clamshell position as shown, and a tablet position. A motherboard 20 couples to main housing portion 14 to interface processing components that cooperate to process information. For example, a central processing unit (CPU) 22 executes instructions to process information in cooperation with a random access memory (RAM) 24 that stores the instructions and information. A solid state drive (SSD) 26 provides persistent storage of information during power down cycles, such as to store an operating system and applications that are retrieved at power up to RAM 24 for execution on CPU 22. A chipset 28 manages CPU 22 operations, such as clock speeds, memory accesses and graphics. A graphics processor unit (GPU) 30 processes information provided by CPU 22 to generate visual images for presentation at display 34, such as pixel values that define pixel colors for application at pixels of display 34. An embedded controller 32 manages system operating conditions, such as power distribution and thermal constraints, and also inputs from input devices, such as a keyboard 38 and touchpad 40 integrated in a housing cover portion 36 disposed over main housing portion 14.

In the example embodiment, a reduced thickness of lid housing portion 16 is provided by coupling a polarizer at the outer surface of display 34 without using a cover glass at the outer surface. For example, the polarizer couples directly to the front face of a display module integrated in an opening defined by the perimeter of lid housing portion 16. InCell touch technology, or similar touch sensors, integrate in the display module so that a cover glass is not needed to support touch sensors. As described in greater detail below, the display module has an outer perimeter that, when installed in lid housing portion 16, leaves a gap between the display module and the perimeter of lid housing portion 16. To provide sufficient strength to the polarizer where it rests over this gap, a support structure couples to the polarizer to provide a frame from the perimeter of lid housing portion 16 to a display area of the display module. The support structure provides rigidity to the polarizer along the edge of the lid housing portion 16 perimeter and an opening over the display area where pixels of the display module present visual images through the polarizer. Although the example embodiment has a single display integrated in a one housing portion, in alternative embodiments the display may integrate in a tablet having a single planar housing portion, in a peripheral display housing, or two displays may be used at both portions of housing 12 by replacing housing cover portion 36 with a display.

Figure 2:
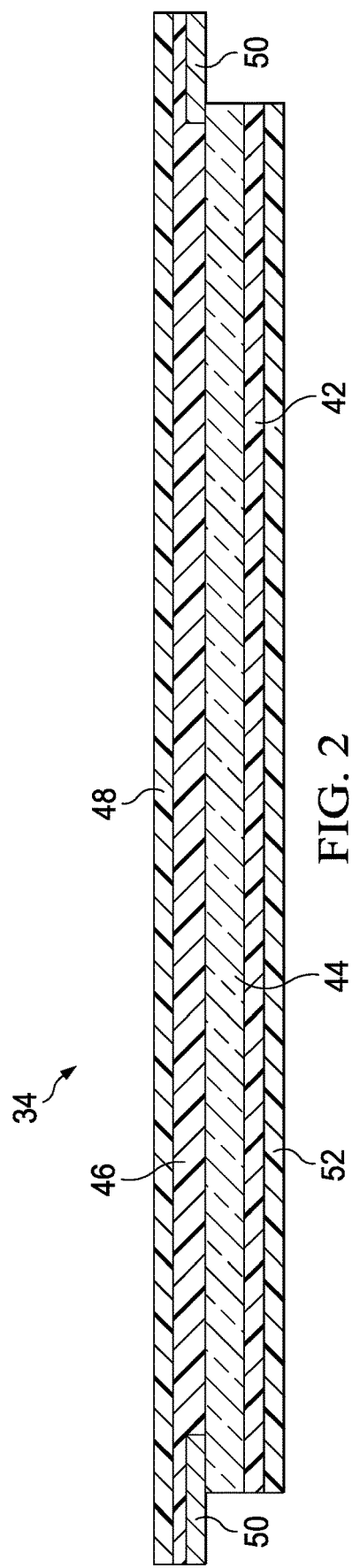
FIG. 2 depicts a side cutaway view of an example configuration of a display that provides a polarizer outer surface for an edge-to-edge display appearance.

Referring now to FIG. 2, a side cutaway view depicts an example configuration of a display 34 that provides a polarizer 48 outer surface for an edge-to-edge display appearance. In the example embodiment, a liquid crystal display module 44 is assembled to couple into an information handling system housing. For example, liquid crystal module 44 has an outer perimeter that fits within the housing to have a gap to the housing outer perimeter. A rear polarizer 42 couples to the bottom surface of liquid crystal module 44 to polarize light provided from an underlying backlight 52 illumination source. A front polarizer 48 and support frame 50 couple to liquid crystal module 44 as a separate assembly and an outer perimeter of substantially the perimeter of the housing opening that accepts display 34. For instance, the outer perimeter of front polarizer 48 and support frame 50 may have some clearance so that a snug fit into the housing perimeter is provided with front polarizer 48 having an appearance at the outer surface of display 34 that extends to the edge of the housing opening for an edge-to-edge appearance. An inner perimeter of support structure 50 overlaps liquid crystal module 44 at its outer perimeter while having a central open area around a display area of liquid crystal module 44, such as the area where pixels are located. An optically clear adhesive 46 couples front polarizer 48 to liquid crystal module 44 and fills the vertical gap created by the height support structure 50 so that the outer surface of display 34 has a planar appearance. As a result of the support provided by support structure 50, display 34 couples into an information handling system housing with front polarizer 48 as the outer layer so that no outer glass cover is needed. Further, display weight is reduced by using a light weight support structure material to support front polarizer 48 instead of extending glass or other structures of liquid crystal module 44 to the edge of the housing. In the example embodiment, support structure 50 is a stainless steel frame, although alternative embodiments might use other metals (like aluminum), ceramics, plastics or carbon fiber. If desired, the outer surface of support structure 50 may be treated for a dark appearance, such as with black paint. Although the example embodiment depicts a liquid crystal module, alternative embodiments may use other display technologies, such as organic light emitting diode films.

Figure 3:
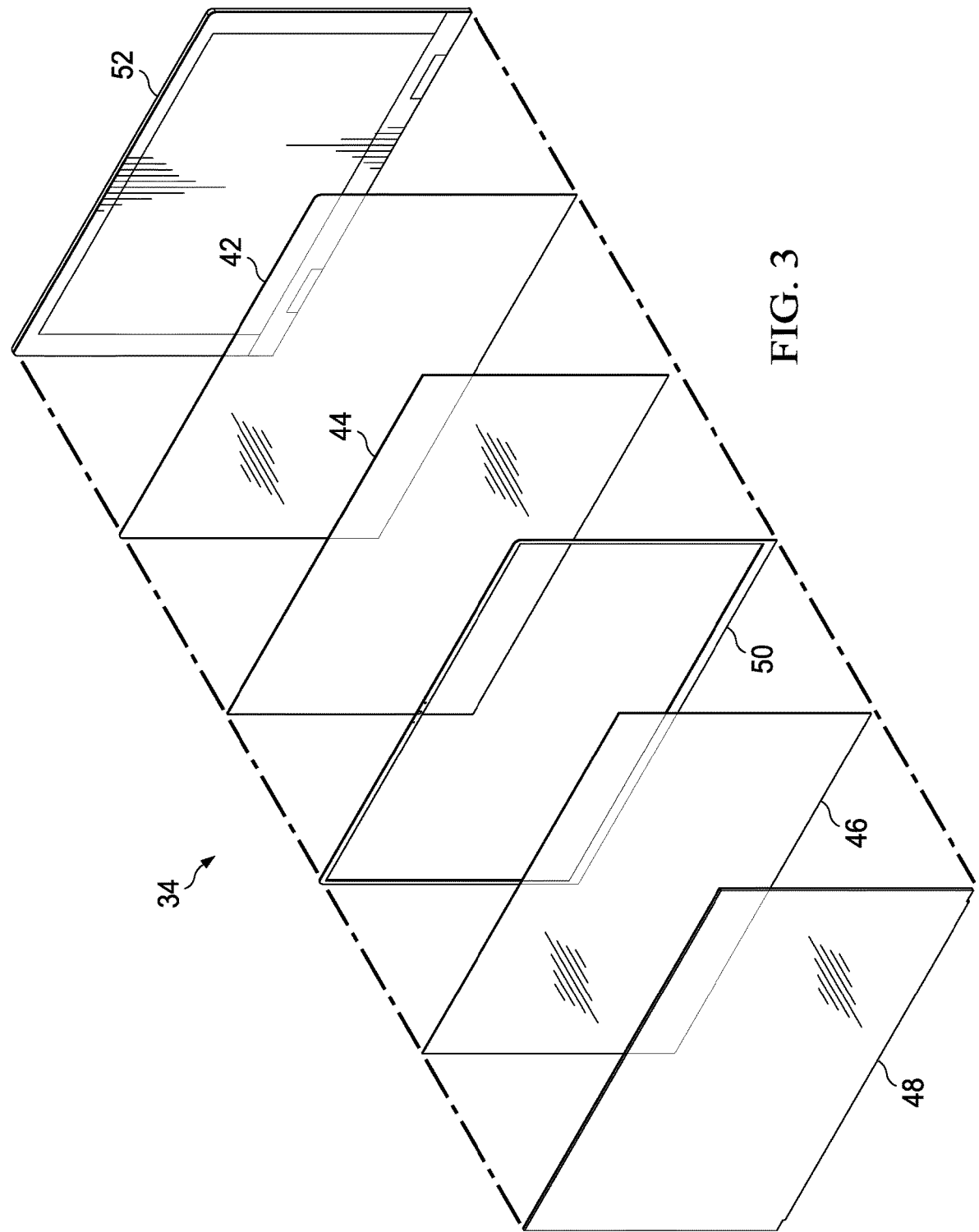
FIG. 3 depicts a front exploded perspective view of a display having an edge-to-edge polarizer outer surface.

Referring now to FIG. 3, a front exploded perspective view depicts a display 34 having an edge-to-edge front polarizer 48 outer surface. In the example embodiment, front polarizer 48 couples to support structure 50 that defines a frame equal to or larger than the perimeter of backlight 52 so that support structure 50 supports the front polarizer beyond the perimeter of the liquid crystal module. A precision cut optically clear adhesive 46, such as a flowable material, couples front polarizer 48 to support structure 50, which is a stainless steel bezel frame, and to liquid crystal module 44 so that any gap between front polarizer 48 and liquid crystal module 44 related to the height of support structure 50 is filled to provide a planar outer surface. Liquid crystal module 44 couples into lid housing portion 16 over a backlight 52 that provides illumination that passes through pixels of the display area to create a visual image. As described above, lid housing portion 16 may include structures that couple backlight 52 and liquid crystal module 44 in place in a central location to the housing perimeter and that define the housing perimeter a distance above where the hinge is coupled so that sufficient room provided to couple the hinge without interference with the display edge.

Figure 4:
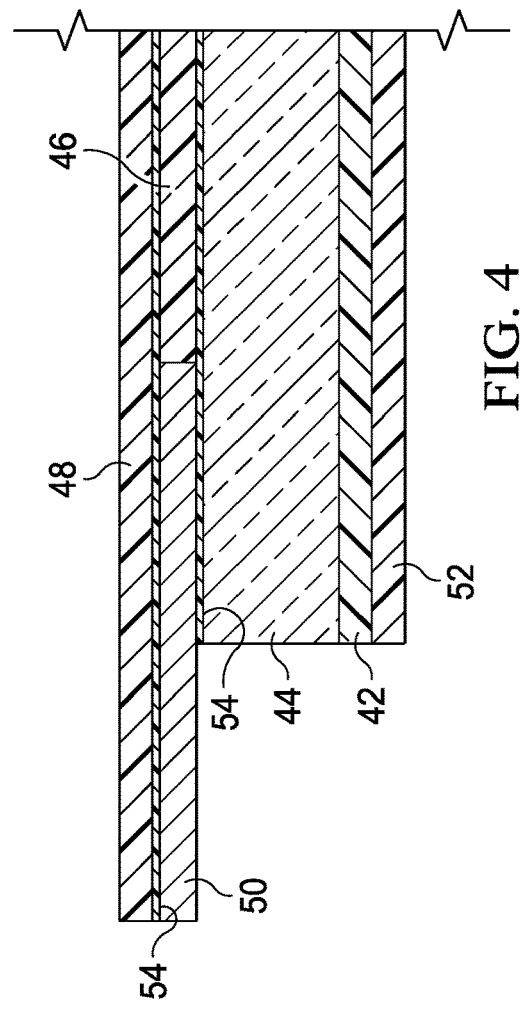
FIG. 4 depicts a side cutaway view of an alternative embodiment of a display having a front polarized outer surface and support structure.

Referring now to FIG. 4, a side cutaway view depicts an alternative embodiment of a display 34 having a front polarizer 48 outer surface and support structure 50. In the example embodiment, support structure 50 is a stainless steel frame having an outer perimeter of substantially the same size as the outer perimeter of front polarizer 48 so that when front polarizer 48 couples into a housing, support is provided for it from edge-to-edge of the front surface of the display. Support structure 50 couples to front polarizer 48 with a first 25 micron thick sheet of optically clear adhesive 54. A second 25 micron thick sheet of optically clear adhesive 54 couples the bottom surface of support structure 50 to liquid crystal module 44 with a partial overlap of the bottom of support structure 50 and the outer perimeter of liquid crystal module 44. The inner perimeter of support structure 50 frames a display area of liquid crystal module 44 having pixels that present visual images. In the example embodiment, support structure 50 has a thickness of approximately 130 microns so that a 180 micron thick layer of flowable optically clear adhesive 46 fills the gap between polarizer 48 and liquid crystal module 44 to have a planar surface across front polarizer 48. A rear polarizer 42 and backlight 52 couple at the bottom of liquid crystal module 44 to provide illumination for visual images.

Figure 5:
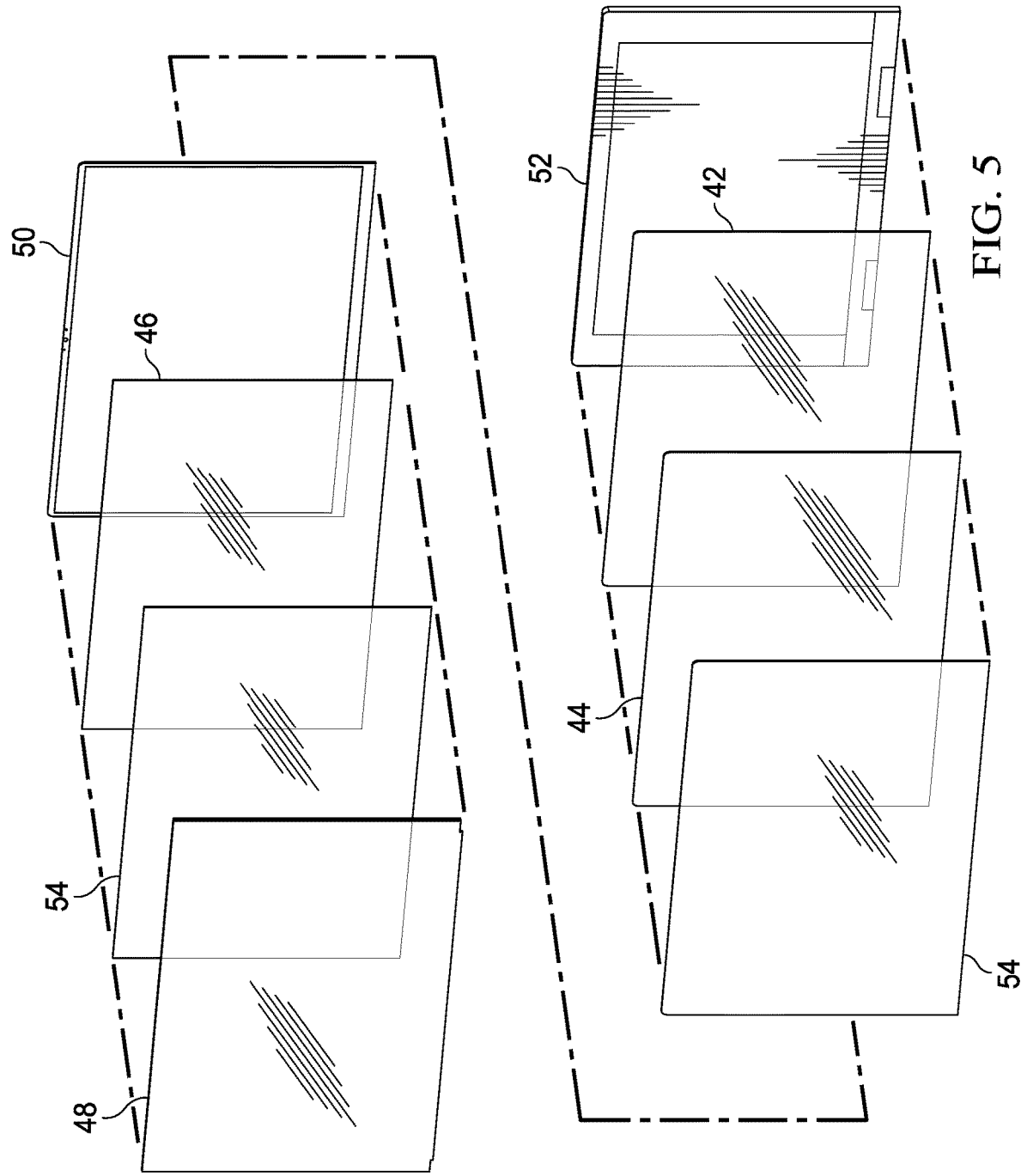
FIG. 5 depicts an exploded side view of the alternative display.

Referring now to FIG. 5, an exploded side view depicts the alternative display 34 having support structure 50 coupled in place with sheets of optically clear adhesive 54. A first sheet of optically clear adhesive 54 cut to match the upper surface of support structure 50 couples polarizer 48 to the upper surface of support structure 50. A second sheet of optically clear adhesive 54 cut to match the overlap of support structure 50 at its inner perimeter with the outer perimeter of liquid display module 44 couples the lower surface of support structure 50 to the upper surface of liquid crystal module 44. A flowable optically clear adhesive 46 is disposed between polarizer 48 and liquid crystal module 44 to couple polarizer 48 in a planar disposition relative to liquid crystal module 44. In one example embodiment, front polarizer 48, support structure 50, the two sheets of optically clear adhesive 54 and flowable optically clear adhesive 46 are assembled in a subassembly before joining the subassembly to liquid crystal module 44 to provide more efficient and cost effective manufacture.

Although the present invention has been described in detail, it should be understood that various changes, substitutions and alterations can be made hereto without departing from the spirit and scope of the invention as defined by the appended claims.

What is claimed is:

1. An information handling system comprising:
   a housing;
   a processor disposed in the housing and operable to execute instructions that process information;
   a memory disposed in the housing and interfaced with the processor, the memory operable to store the instructions and information;
   a graphics processor disposed in the housing and interfaced with the processor, the graphics processor operable to process the information to define visual images for presentation at a display; and
   a display integrated in the housing and interfaced with the graphics processor, the display having a display module with a first perimeter and operable to present the visual images at an area within the first perimeter, a polarized cover having a second perimeter of greater than the first perimeter and having a polarized outer surface exposed at an exterior side of the display, and a support structure disposed between the display module and the polarized cover, the support structure having an inner perimeter that overlaps the display module first perimeter that defines an opening through which the display module presents visual images and an outer perimeter of substantially the second perimeter, the housing integrating the display within an opening having substantially the second perimeter.

2. The information handling system of claim 1 further comprising:
   an optically clear adhesive disposed between the display module and the polarized cover and between the polarized cover and support structure;

wherein forms a contiguous layer under the polarized cover.

3. The information handling system of claim 1 wherein the support structure comprises a stainless steel frame having an inner perimeter of substantially a perimeter of a pixel area of the display.

4. The information handling system of claim 3 wherein the stainless steel frame has a black coating disposed at a side facing the polarized cover.

5. The information handling system of claim 4 wherein the display module comprises a liquid crystal display module and the display further comprises:
   a backlight disposed in the housing under the display module; and
   a polarizer disposed between the display module and the backlight.

6. The information handling system of claim 1 further comprising:
   a first sheet of optically clear adhesive coupling the support structure to the polarized cover;
   a second sheet of optically clear adhesive coupling the support structure to the display module; and
   flowable optically clear adhesive disposed between the polarized cover and display module.

7. The information handling system of claim 6 wherein the support structure comprises stainless steel formed as a frame.

8. The information handling system of claim 7 further comprising a dark coating disposed over the stainless steel surface at the polarizer cover.

9. The information handling system of claim 8 wherein the display module comprises an organic light emitting diode display film.

10. An information handling system comprising: a housing having a portion with an opening of a first perimeter; a processor disposed in the housing and operable to execute instructions that process information; a memory disposed in the housing and interfaced with the processor, the memory operable to store the instructions and information; a display module disposed in the housing opening, the display module having a second perimeter of less than the first perimeter and a display area within the second perimeter at which the display module presents visual images; a support structure coupled to the display module, the support structure having an inner perimeter that overlaps the display module first perimeter to define an opening through which the display module presents visual images and having an outer perimeter of substantially the first perimeter, the display module presenting visual images through the inner perimeter; and a polarizer having a perimeter of substantially the first perimeter, the polarizer coupled to the support structure and exposed at an exterior of the housing, and the polarizer having a polarized outer surface exposed at an exterior side of the display module.

11. The display of claim 10 wherein the support structure comprises a stainless steel frame and the polarizer is the outer surface of the display, the stainless steel frame having a darkened outer surface.

12. The display of claim 10 further comprising a flowable optically clear adhesive coupling the polarizer to the display module.

13. The display of claim 12 further comprising one or more optically clear adhesive sheets coupling the support structure to the display module and the polarizer.

* * * * *